(12) United States Patent
Soyano et al.

(10) Patent No.: US 8,030,749 B2
(45) Date of Patent: Oct. 4, 2011

(54) SEMICONDUCTOR DEVICE

(75) Inventors: Shin Soyano, Shiojiri (JP); Katsumichi Ueyanagi, Matsumoto (JP)

(73) Assignee: Fuji Electric Systems Co., Ltd., Shinagawa-Ku, Tokyo (JP)

( * ) Notice: Subject to any disclaimer, the term of this patent is extended or adjusted under 35 U.S.C. 154(b) by 264 days.

(21) Appl. No.: 12/292,480

(22) Filed: Nov. 20, 2008

(65) Prior Publication Data

US 2009/0140414 A1    Jun. 4, 2009

(30) Foreign Application Priority Data

Dec. 4, 2007    (JP) ................................. 2007-313488

(51) Int. Cl.
*H01L 23/48* (2006.01)
(52) U.S. Cl. ........ 257/688; 257/689; 257/691; 257/698; 257/702; 257/703; 257/724
(58) Field of Classification Search .................. None
See application file for complete search history.

(56) References Cited

U.S. PATENT DOCUMENTS

| 3,947,080 | A | * | 3/1976 | Ege ................................ 439/249 |
| 5,306,949 | A | | 4/1994 | Yamada et al. |
| 5,519,252 | A | | 5/1996 | Soyano et al. |
| 6,011,302 | A | | 1/2000 | Nakahira |
| 2002/0196609 | A1 | * | 12/2002 | Golightly et al. ............. 361/736 |
| 2003/0015778 | A1 | * | 1/2003 | Soyano et al. ................ 257/678 |
| 2008/0042142 | A1 | * | 2/2008 | Sugawara et al. .............. 257/77 |

FOREIGN PATENT DOCUMENTS

| JP | 08007956 A | * | 1/1996 |
| JP | H08-125115 | | 5/1996 |
| JP | H08-204115 | | 8/1996 |
| JP | 11168168 A | * | 6/1999 |
| JP | 2002-368192 | | 12/2002 |
| JP | 2003249624 A | * | 9/2003 |
| JP | 2005-064441 | | 3/2005 |
| JP | 2006-013273 | | 1/2006 |

* cited by examiner

*Primary Examiner* — David Graybill
(74) *Attorney, Agent, or Firm* — Manabu Kanesaka

(57) ABSTRACT

A semiconductor device includes a resin case, a plurality of external connection terminals fixedly provided on the resin case, and at least one semiconductor element provided in the resin case. At least one terminal block has at least one wiring terminal for electrically connecting the semiconductor element and the external connection terminals.

9 Claims, 11 Drawing Sheets

SEMICONDUCTOR DEVICE

BACKGROUND OF THE INVENTION AND RELATED ART STATEMENT

The present invention relates to a semiconductor device. Particularly, it relates to a semiconductor device including semiconductor elements housed in a resin case.

In an apparatus such as an inverter apparatus, an uninterruptible power supply, a machine tool or an industrial robot, a semiconductor device (general purpose module) including power semiconductor elements mounted therein is used independently of a body of the apparatus. Such a semiconductor device has a structure in which power semiconductor elements are sealed (housed) in a resin case (e.g. see Patent Documents 1: Japanese Unexamined Patent Application Publication No. JP-A-6-045518, and Patent Document 2: Japanese Unexamined Patent Application Publication No. JP-A-2002-368192).

Wiring terminals (lead frames) are generally used for internally wiring such a semiconductor device (e.g. see Patent Document 3: Japanese Unexamined Patent Application Publication No. JP-A-2005-064441).

Figure 11:
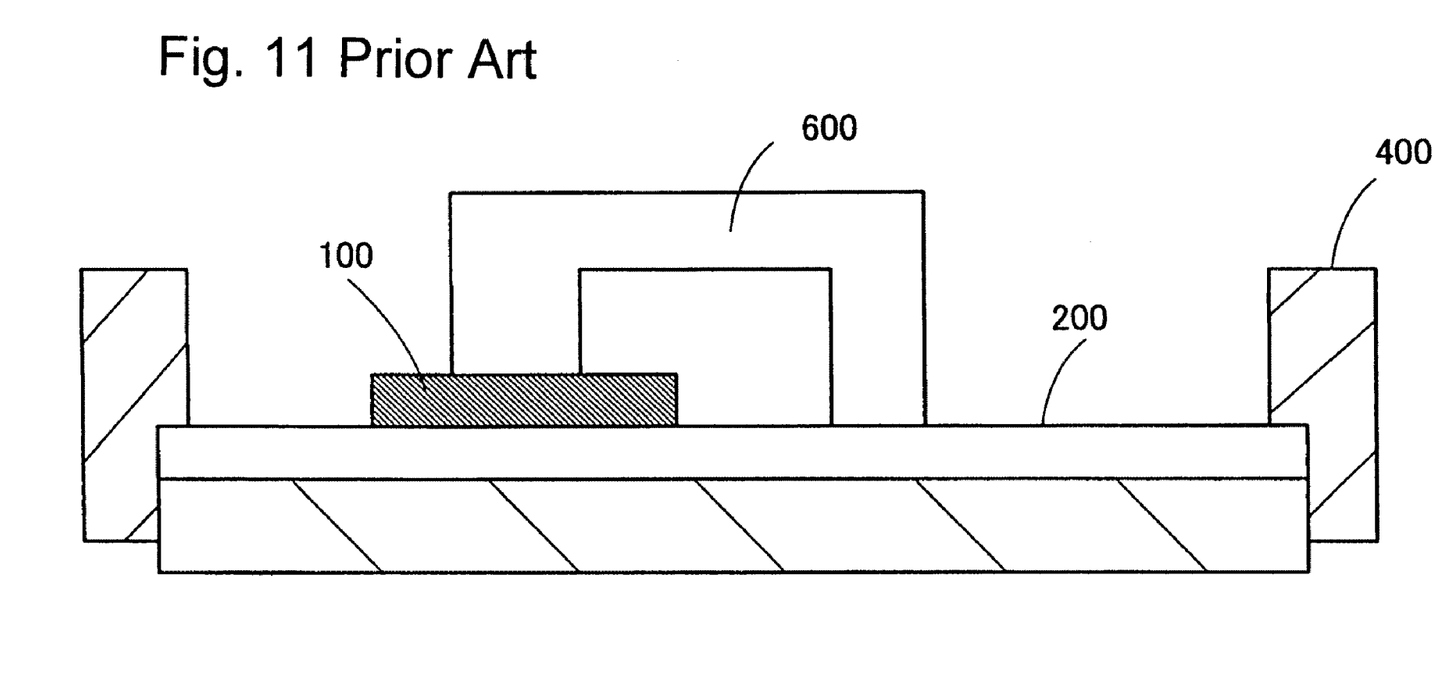
FIG. 11 is a schematic view of a main part of a semiconductor device according to the conventional art in which a power semiconductor element is sealed in a resin case.

For example, FIG. 11 is a schematic view showing main part of a semiconductor device including a power semiconductor element housed in a resin case. FIG. 11 shows an example of the semiconductor device which is internally wired by use of a wiring terminal.

As shown in FIG. 11, the semiconductor device includes an IGBT (Insulated Gate Bipolar Transistor) element 100 disposed in a resin case 400. The IGBT element 100 mentioned herein is a vertical power semiconductor element which has an emitter electrode disposed in its upper surface, and a collector electrode disposed in its lower surface. The emitter electrode of the IGBT element 100 and a wiring substrate 200 are conductively connected to each other through a wiring terminal 600. The collector electrode of the IGBT element 100 is conductively connected to the wiring substrate 200 directly.

The emitter electrode and the wiring substrate 200 are generally joined to each other through the wiring terminal 600, for example, by soldering, ultrasonic bonding, laser welding or the like.

In the aforementioned semiconductor device, there was however a problem that it was impossible to change the layout of the wiring terminal 600 easily.

The invention has been developed in consideration of the aforementioned problem.

An object of the invention is to provide a semiconductor device which includes semiconductor elements housed in a resin case and in which it is possible to change the layout of at least one wiring terminal easily.

Further objects and advantages of the invention will be apparent from the following description of the invention.

SUMMARY OF THE INVENTION

In order to solve the foregoing problem, according to the invention, there is provided a semiconductor device including: a plurality of external connection terminals fixedly supported in a resin case; at least one semiconductor element housed in the resin case; and at least one terminal block provided with at least one wiring terminal through which the semiconductor element is electrically connected to the external connection terminals.

According to the aforementioned configuration, it is possible to achieve a semiconductor device which is provided with semiconductor elements housed in the resin case and in which the layout of the wiring terminal can be changed easily.

DETAILED DESCRIPTION OF PREFERRED EMBODIMENTS

Embodiments of the present invention as to a semiconductor device will be described below in detail with reference to the drawings.

First Embodiment

Figure 1A:
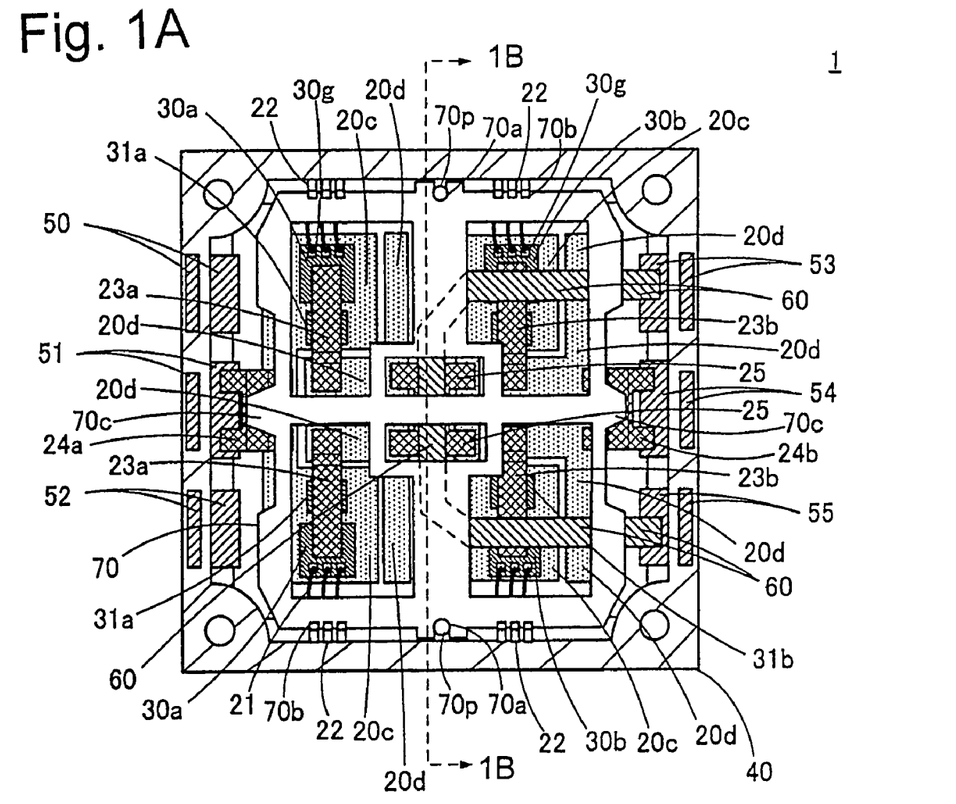
FIGS. 1A and 1B are schematic views of main part of a semiconductor device according to a first embodiment of the invention.
Figure 1B:
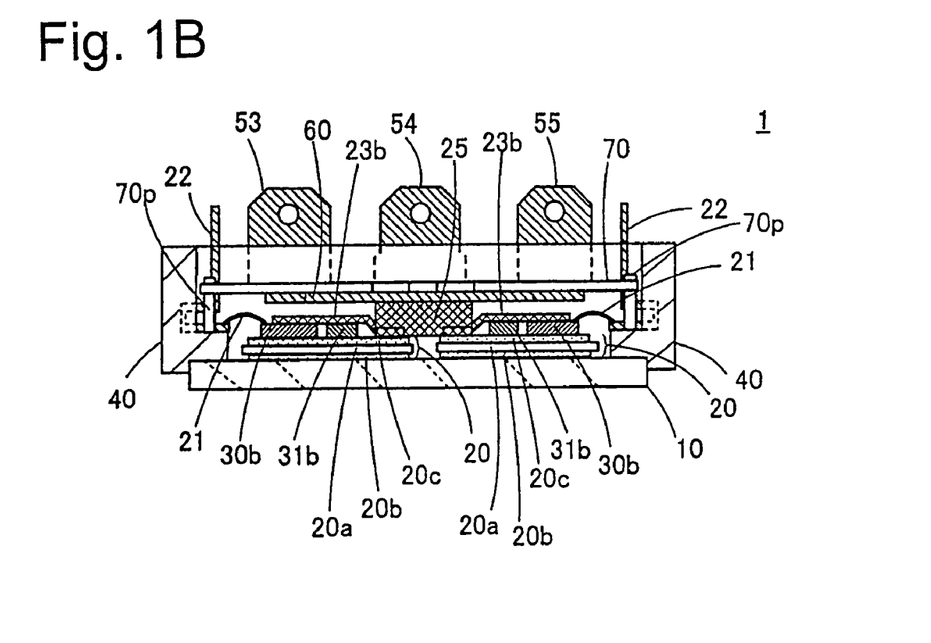

FIGS. 1A and 1B are schematic views showing main part of a semiconductor device according to a first embodiment of the invention. FIG. 1A shows a schematic plan view of the semiconductor device. FIG. 1B shows a sectional view of the semiconductor device taken along line 1B-1B in FIG. 1A and viewed in an arrow direction. Incidentally, FIGS. 1A and 1B show an example of a semiconductor module corresponding to one phase of an inverter circuit.

The semiconductor device 1 shown in FIGS. 1A and 1B has a metal base plate 10 with a thickness of the order of millimeters as a substrate. Each insulating substrate 20 is joined and mounted onto the metal base plate 10 through a lead-free tin-silver (Sn—Ag) type solder layer (not shown). IGBT elements 30a, 30b as power semiconductor elements and FWD elements 31a, 31b are mounted on upper layers of the insulating substrates 20, respectively. The semiconductor device 1 further has a resin case 40 housing the aforementioned semiconductor elements, etc., so that the semiconductor device 1 functions as a so-called general-purpose IGBT module (power module).

Each insulating substrate 20 includes an insulating plate 20a, a metal foil 20b formed under a lower surface of the insulating plate 20a by a DCB (Direct Copper Bonding) method, and a metal foil 20c formed on an upper surface of the insulating plate 20a by the same DCB method.

At least one of the IGBT element 30a, 30b is mounted on the metal foil 20c of each insulating substrate 20 through a solder layer (not shown) while a back side (e.g. a collector electrode side) of the IGBT element 30a or 30b is joined onto the metal foil 20c.

An emitter electrode is disposed on a principle surface of the IGBT element 30a or 30b opposite to the collector electrode. That is, on an upper surface side of the IGBT element 30a or 30b. Control electrodes 30g are further disposed on a part of the upper surface of the IGBT element 30a or 30b. Each control electrode 30g is conductively connected, through a metal wire 21, to one end of a pin terminal (control terminal) 22 insert-molded (sealed) in the resin case 40. The other end of the pin terminal 22 is extended upward from the semiconductor device 1 to a higher position than an upper surface of the resin case 40.

Each FWD element 31a or 31b is mounted on the metal foil 20c while a cathode side of the FWD element 31a or 31b is joined to the metal foil 20c through a solder layer (not shown). An anode side of the FWD element 31a or 31b is disposed on a principle surface of the FWD element 31a or 31b opposite to the cathode side, i.e. on an upper surface of the FWD element 31a or 31b.

An integral terminal 23a or 23b having a bent structure is laid between the emitter electrode of the IGBT element 30a or 30b (the upper surface side of the IGBT element 30a or 30b) and the anode side of the FWD element 31a or 31b (the upper surface side of the FWD element 31a or 31b) by a method such as soldering, ultrasonic bonding, laser welding or screwing (hereinafter collectively referred to as soldering or the like). Thus, electrical connection between the emitter electrode of the IGBT element 30a or 30b and the anode side of the FWD element 31a or 31b is ensured through the terminal 23a or 23b.

The terminal 23a or 23b is further extended to a metal foil 20d which is patterned into an L-shape in the resin case 40. The terminal 23a or 23b and the metal foil 20d are electrically connected to each other by soldering or the like.

The collector electrode of the IGBT element 30a or 30b and the cathode side of the FWD element 31a or 31b are conductively connected to each other through the metal foil 20c which is a layer disposed under the IGBT element 30a or 30b and the FWD element 31a or 31b.

For example, each insulating plate 20a is made of an alumina ($Al_2O_3$)-sintered ceramic material, and each of the metal foils 20b, 20c and 20d is made of a metal material containing copper (Cu) as a main component. For example, each of the terminals 23a and 23b is made of a material containing a metal such as copper (Cu) or aluminum (Al) or an alloy thereof as a main component.

The semiconductor element mounted on the metal foil 20c is not limited to the aforementioned IGBT element 30a or 30b but may include a power MOSFET (Metal Oxide Semiconductor Field Effect Transistor).

In the semiconductor device 1, the resin case 40, for example, made of PPS (Polyphenylene Sulfide) is provided so as to be fixed to an upper edge of the metal base plate 10. External connection terminals 50, 51, 52, 53, 54 and 55, for example, conductively connected to principal electrodes of the IGBT elements 30a and 30b are insert-molded in part of the resin case 40.

In the semiconductor device 1, the external connection terminals 51, 54 are disposed so that, for example, the external connection terminal 51 serves as a positive electrode input terminal (P terminal) of the inverter circuit while the external connection terminal 54 serves as a negative electrode input terminal (N terminal) of the inverter circuit. These external connection terminals 51 and 54 are electrically connected to positive and negative electrodes, respectively, of a DC power supply disposed in the outside of the semiconductor device 1.

In addition, the external connection terminals 53, 55 are disposed so that the external connection terminals 53, 55 serve as AC output terminals (e.g. U phase) of the inverter circuit.

Although the circuit configuration is illustrated by means of the inverter circuit, this circuit configuration is not limited to the inverter circuit but may be applied to another electric power conversion circuit such as a chopper circuit.

Incidentally, the remaining external connection terminals 50, 52 are reserve terminals.

For example, an end of a terminal holder 24a is joined to the external connection terminal 51 by soldering or the like. Further, the other end of the terminal holder 24a is joined to the metal foil 20c by soldering or the like.

In this manner, in the semiconductor device 1, the external connection terminal 51 fixedly provided in the resin case 40 and the metal foil 20c are electrically connected to each other through the terminal holder 24a. That is, the external connection terminal 51 is conductively connected to the collector electrodes of the IGBT elements 30a and the cathode sides of the FWD elements 31a.

One end of a terminal holder 24b is joined to the external connection terminal 54 by soldering or the like. Further, the other end of the terminal holder 24b is joined to the metal foil 20d by soldering or the like.

In this manner, in the semiconductor device 1, the external connection terminal 54 fixedly provided in the resin case 40 and the metal foil 20d are electrically connected to each other through the terminal holder 24b. That is, the external connection terminal 54 is conductively connected to the emitter electrodes of the IGBT elements 30b and the anode sides of the FWD elements 31b.

In addition, ends of a U-shaped wiring terminal (lead frame) 60 are joined to the external connection terminals 53 and 55 respectively by soldering or the like. A central portion of the wiring terminal 60 is joined to an upper surface of a terminal holder 25 by soldering or the like. A lower surface of the terminal holder 25 is joined to the metal foils 20c, 20d by soldering or the like.

In this manner, in the semiconductor device 1, the ends of the wiring terminal 60 are electrically connected to the external connection terminals 53, 55 fixedly provided in the resin case 40. In addition, the central portion of the wiring terminal 60 is electrically connected to the emitter electrodes of the IGBT elements 30a and the anode sides of the FWD elements 31a through the terminal holder 25. Further, the central portion of the wiring terminal 60 is electrically connected to the collector electrodes of the IGBT elements 30b and the cathode sides of the FWD elements 31b through the terminal holder 25.

In addition, in the semiconductor device 1, the aforementioned wiring terminal 60 is fixed to an insulating plate (support substrate) 70 through an adhesive member (not shown). The insulating plate 70 contains a resin or ceramic material as a main component. Notches 70a are provided in opposite ends of the insulating plate 70. The notches 70a are fitted to fixation pins 70p fixedly provided at internal ends of the resin case 40.

By such fitting, the insulating plate 70 is accurately positioned relative to the resin case 40. Extension portions 70c are provided in the insulating plate 70. The extension portions 70c are placed on the terminal holders 24a, 24b to thereby ensure horizontal stability of the insulating plate 70.

Notches 70b for receiving side portions of the pin terminals 22 are further provided in the insulating plate 70. The notches 70b support the side portions of the pin terminals 22.

A space surrounded by the resin case 40 and the metal base plate 10 is filled with a sealing resin (not shown) in order to protect the semiconductor elements, the metal wires 21, etc. For example, the sealing resin is provided as a resin containing a gel or epoxy resin as a main component.

In addition, for example, each of the external connection terminals 50, 51, 52, 53, 54 and 55, the wiring terminal 60 and the terminal holders 24a, 24b and 25 is made of a material containing a metal such as copper (Cu) or aluminum (Al) or an alloy thereof as a main component.

Incidentally, the wiring terminal 60 may be insert-molded in the insulating plate 70 instead of being fixed to the insulating plate 70.

A combination of the wiring terminal 60 and the insulating plate 70 shown in FIGS. 1A and 1B is referred to as terminal block (wiring unit).

As described above, the semiconductor device 1 has a plurality of external connection terminals 50, 51, 52, 53, 54 and 55 fixedly supported in a resin case 40, at least one semiconductor element (e.g. IGBT element 30a or 30b or the like) housed in the resin case 40, and at least one terminal block provided with at least one wiring terminal 60 through which the semiconductor element is electrically connected to the external connection terminals 50, 51, 52, 53, 54 and 55.

Description will be given below to advantageous effects of the semiconductor device 1 having such a structure.

For example, FIGS. 2 to 7 are schematic views showing main part of the semiconductor device for explaining the effects of the semiconductor device.

Incidentally, in the drawings related to all embodiments which will be described below, members the same as those in FIGS. 1A and 1B are referred to by the same numerals. Detailed description of these members will be omitted if these members are described once above.

First, in the semiconductor device 1, the wiring terminal 60 can be arranged easily in the resin case 40.

Figure 2:
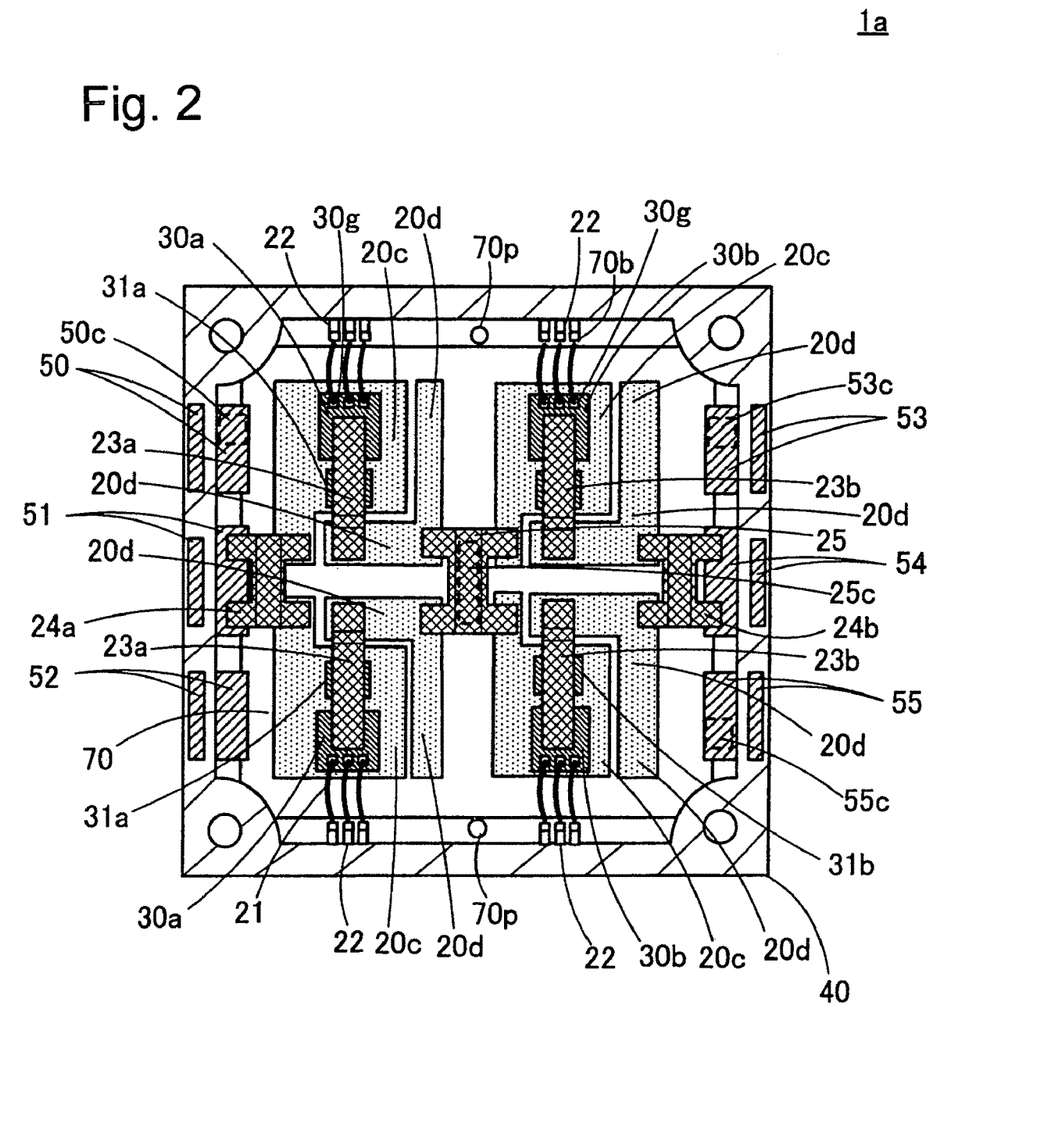
FIG. 2 is a schematic view of main part of the semiconductor device for explaining effects of the semiconductor device (part 1).
Figure 3:
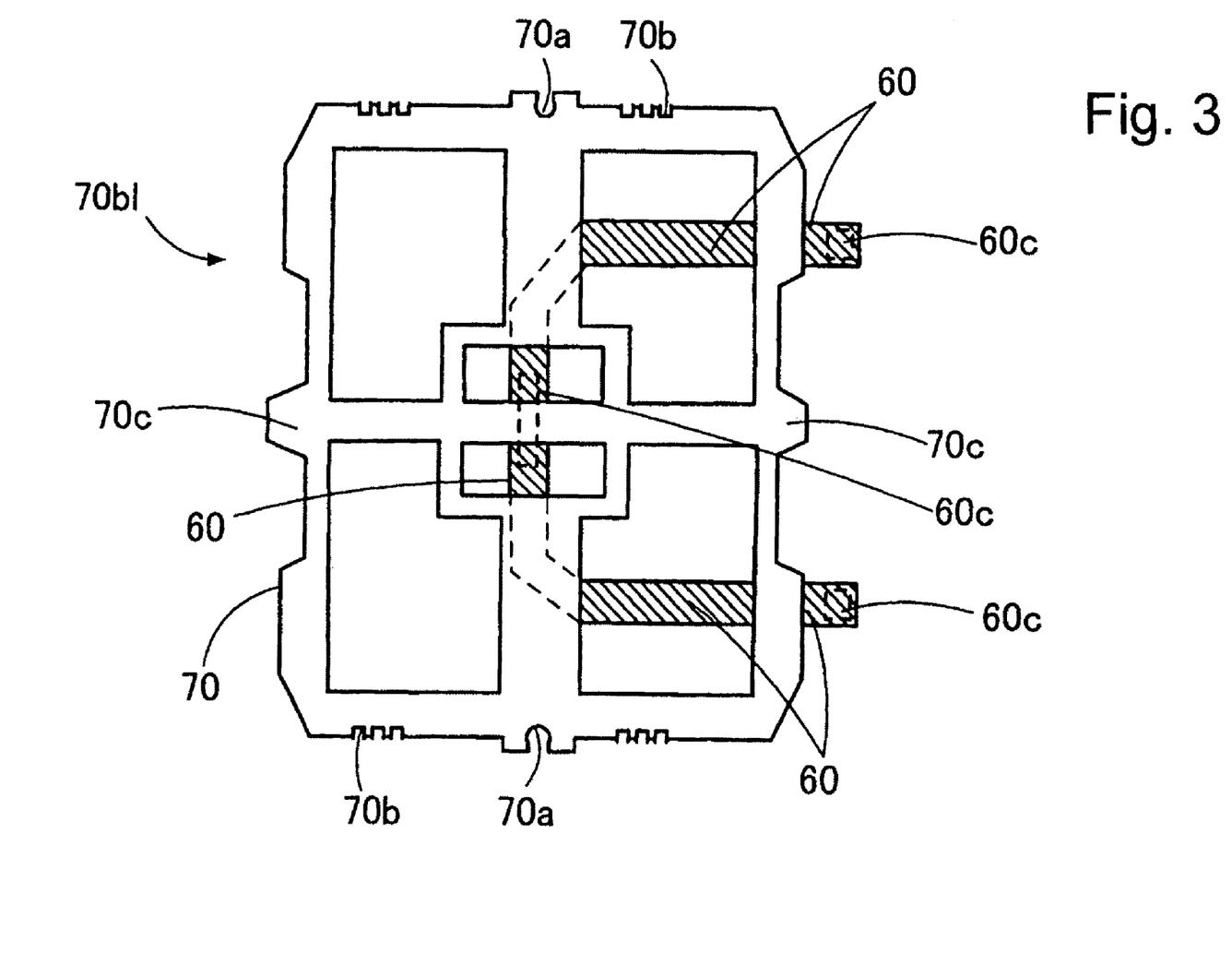
FIG. 3 is a schematic view of main part of the semiconductor device for explaining effects of the semiconductor device (part 2).

FIG. 2 shows a state of the semiconductor device 1 after the insulating plate 70 including the wiring terminal 60 fixed thereto is removed from the semiconductor device 1, that is, FIG. 2 shows a semiconductor device 1a. FIG. 3 shows the insulating plate 70 after the insulating plate 70 including the wiring terminal 60 fixed thereto is removed from the semiconductor device 1, that is, FIG. 3 shows a terminal block 70b1.

For example, after the terminal block 70b1 shown in FIG. 3 is located above the semiconductor-device 1a shown in FIG. 2, the terminal block 70b1 is brought close to the semiconductor device 1a so that the notches 70a of the terminal block 70b1 are fitted to the fixation pins 70p of the semiconductor device 1a.

In this manner, the terminal block 70b1 is accurately positioned relative to the resin case 40. Moreover, the extension portions 70c of the insulating plate 70 come into contact with the terminal holders 24a, 24b so that the insulating plate 70 is horizontally stabilized.

In addition, the terminal block 70b1 is fitted into the resin case 40 so that joint portions 60c of the wiring terminal 60 come into contact with a joint portion 53c of the external connection terminal 53, a joint portion 55c of the external connection terminal 55 and a joint portion 25c of the terminal holder 25, respectively. The notches 70b of the insulating plate 70 receive the side portions of the pin terminals 22 to thereby support the side portions of the pin terminals 22.

Then, the joint portions 60c of the wiring terminal 60 are joined to the joint portion 53c of the external connection terminal 53, the joint portion 55c of the external connection terminal 55 and the joint portion 25c of the terminal holder 25 respectively by soldering or the like.

Thus, the wiring terminal can be arranged easily in the resin case 40.

In the semiconductor device 1, several kinds of terminal blocks 70b1 including wiring terminals 60 with modified wiring patterns may be prepared so that the layout of each wiring terminal drawn from the external connection terminals 50, 51, 52, 53, 54 and 55 can be changed freely even when the external connection terminals 50, 51, 52, 53, 54 and 55 are fixed and supported in the resin case 40.

Figure 4:
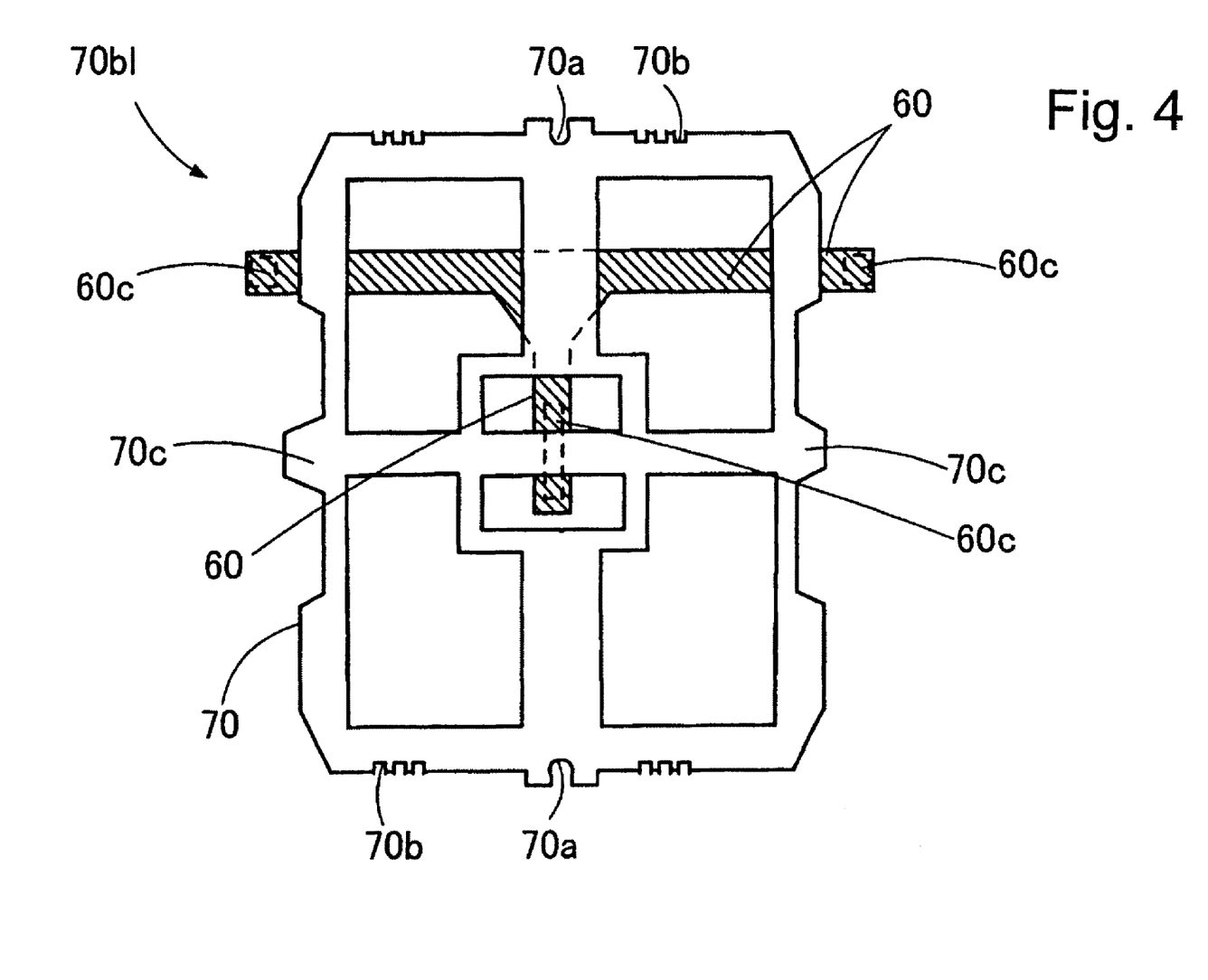
FIG. 4 is a schematic view of main part of the semiconductor device for explaining effects of the semiconductor device (part 3).

For example, in a terminal block 70b1 shown in FIG. 4, a T-shaped wiring terminal 60 is fixed to the insulating plate 70. After such a terminal block 70b1 is fitted to the semiconductor device 1a shown in FIG. 2, the joint portions 60c of the wiring terminal 60 are joined to the joint portion 50c of the external connection terminal 50, the joint portion 53c of the external connection terminal 53 and the joint portion 25c of the terminal holder 25 respectively by soldering or the like.

This layout of the wiring terminal 60 enables the external connection terminals 50, 53 to serve as AC output terminals.

Figure 5:
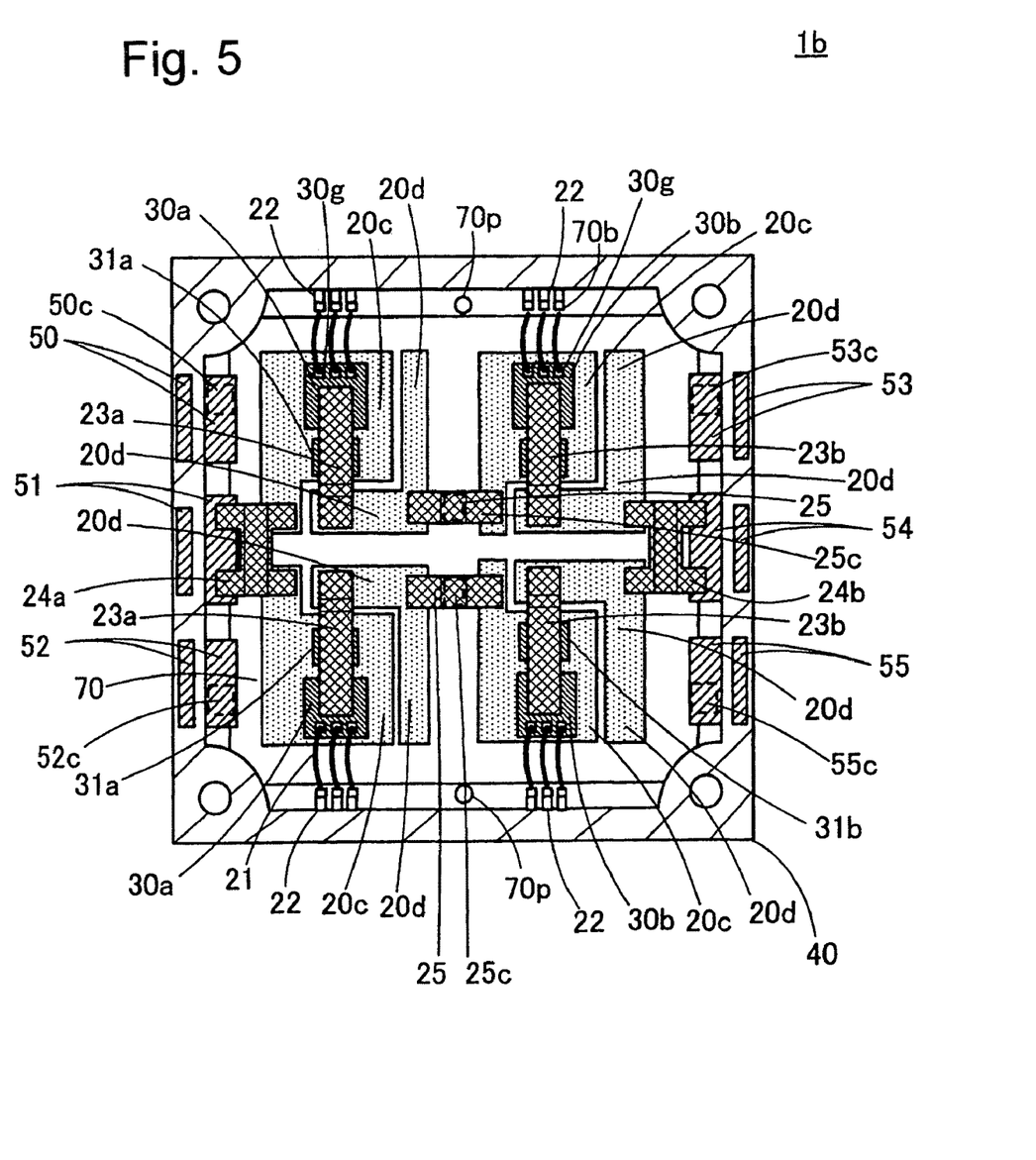
FIG. 5 is a schematic view of main part of the semiconductor device for explaining effects of the semiconductor device (part 4).

FIG. 5 shows the state of another semiconductor device after the insulating plate 70 including the wiring terminal 60 fixed thereto is removed from the semiconductor device 1. That is, FIG. 5 shows a semiconductor device 1b having a structure in which the terminal holder 25 of the semiconductor device 1a shown in FIG. 2 is separated into two at the center.

A terminal block 70b1 can be provided also in the semiconductor device 1b.

Figure 6:
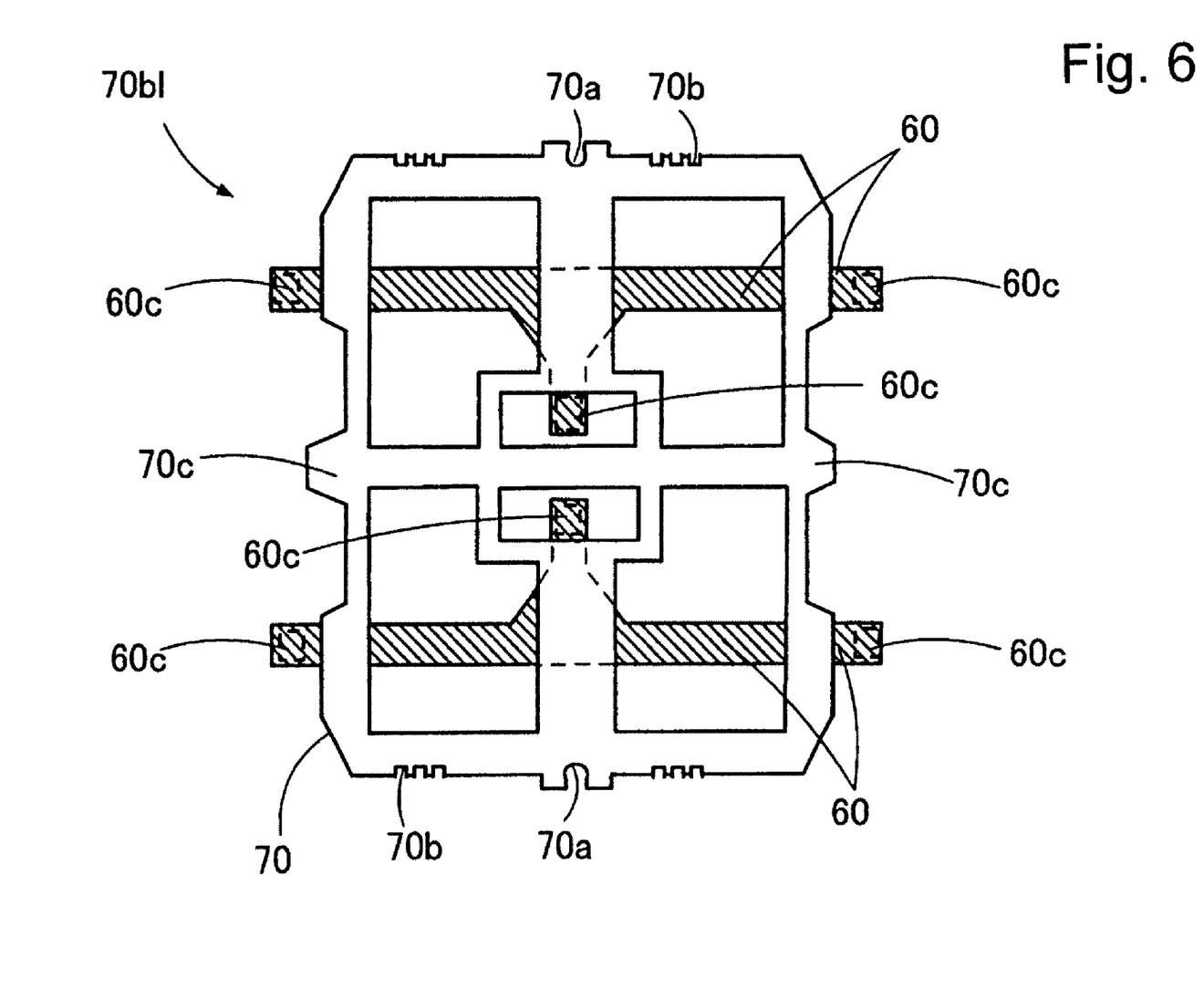
FIG. 6 is a schematic view of main part of the semiconductor device for explaining effects of the semiconductor device (part 5).

Description will be described on the case where, for example, a terminal block 70b1 shown in FIG. 6 is attached to the semiconductor device 1b. In the terminal block 70b1 shown in FIG. 6, T-shaped wiring terminals 60 are fixed to the insulating plate 70 so as to be linearly symmetrical to each other.

Figure 7:
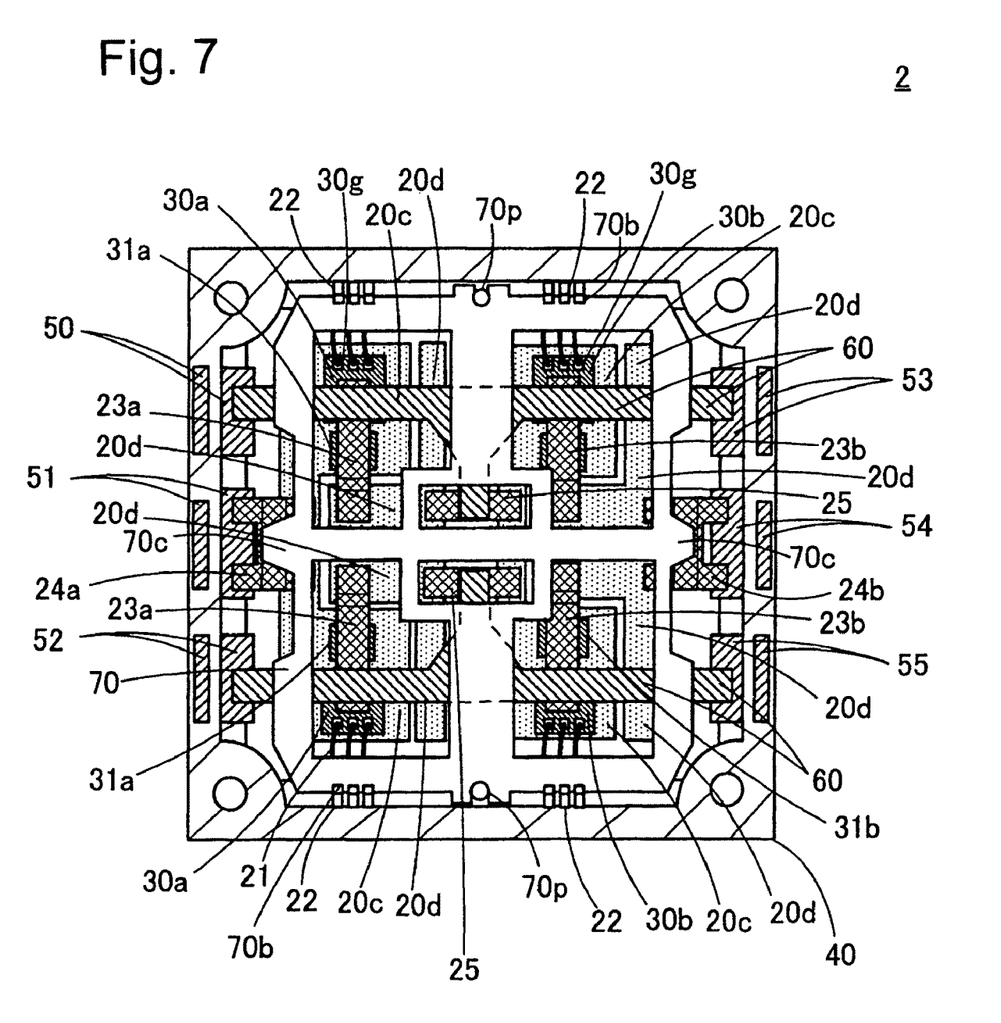
FIG. 7 is a schematic view of main part of the semiconductor device for explaining effects of the semiconductor device (part 6).

After such a terminal block 70b1 is fitted to the semiconductor device 1b shown in FIG. 5, the joint portions 60c of the wiring terminals 60 are joined to the joint portion 50c of the external connection terminal 50; the joint portion 52c of the external connection terminal 52; the joint portion 53c of the external connection terminal 53; the joint portion 55c of the external connection terminal 55, and the joint portion 25c of the terminal holder 25 respectively by soldering or the like. FIG. 7 shows the form of a semiconductor device 2 after the joining.

As shown in FIG. 7, the semiconductor device 2 is provided with two groups of AC output terminals which are different in phase etc. and which are formed from a combination of the external connection terminals 50, 53 and a combination of the external connection terminals 52, 55, respectively.

As described above, in this embodiment, it is possible to change the layout of the AC output terminals to thereby change the phase of the inverter circuit easily.

Moreover, in this embodiment, the configuration of the semiconductor device can be used in common to the semiconductor devices 1a, 1b shown in FIGS. 2 and 5. As desired by a user, one of terminal blocks 70b1 prepared in various forms can be fitted to the semiconductor device 1a or 1b and the external connection terminals 50, 51, 52, 53, 54 and 55 can be joined to a corresponding wiring terminal or terminals 60 so that the layout of the wiring terminal or terminals 60 can be selected freely.

Moreover, the layout of the external wiring to be connected to the external connection terminals 50, 51, 52, 53, 54 and 55 can be selected freely in accordance with a user's desire.

That is, the form of each wiring terminal 60 fixed to the insulating plate 70 can be changed so that any one of the external connection terminals 50, 51, 52, 53, 54 and 55 can be set as a positive electrode input terminal while any one of the external connection terminals 50, 51, 52, 53, 54 and 55 can be set as a negative electrode input terminal. Any ones of the external connection terminals 50, 51, 52, 53, 54 and 55 can be set as AC output terminals. Moreover, the phase of the inverter circuit can be changed easily in accordance with necessity.

Moreover, the length, width and thickness of each wiring terminal 60 can be adjusted so that wiring resistance, reactance, heat release, etc. can be adjusted freely in accordance with performance of the circuit.

In addition, since the terminal block 70b1 is provided independent of the semiconductor device 1a or 1b, at least one part of the wiring terminal 60, e.g. a lower layer of the wiring terminal 60 can be plated with nickel (Ni) and gold (Au) or with nickel (Ni) and tin (Sn) by another process than the process of producing the semiconductor device 1a or 1b.

Incidentally, the semiconductor device 1 or 2 may be provided as a so-called metal baseless structure in which the metal base plate 10 is removed so that the insulating substrate 20 is used as a substrate of the semiconductor device 1 in order to attain further reduction in size and weight of the semiconductor device.

In addition, the insulating plate 70 is not limited to the aforementioned forms.

Figure 8:
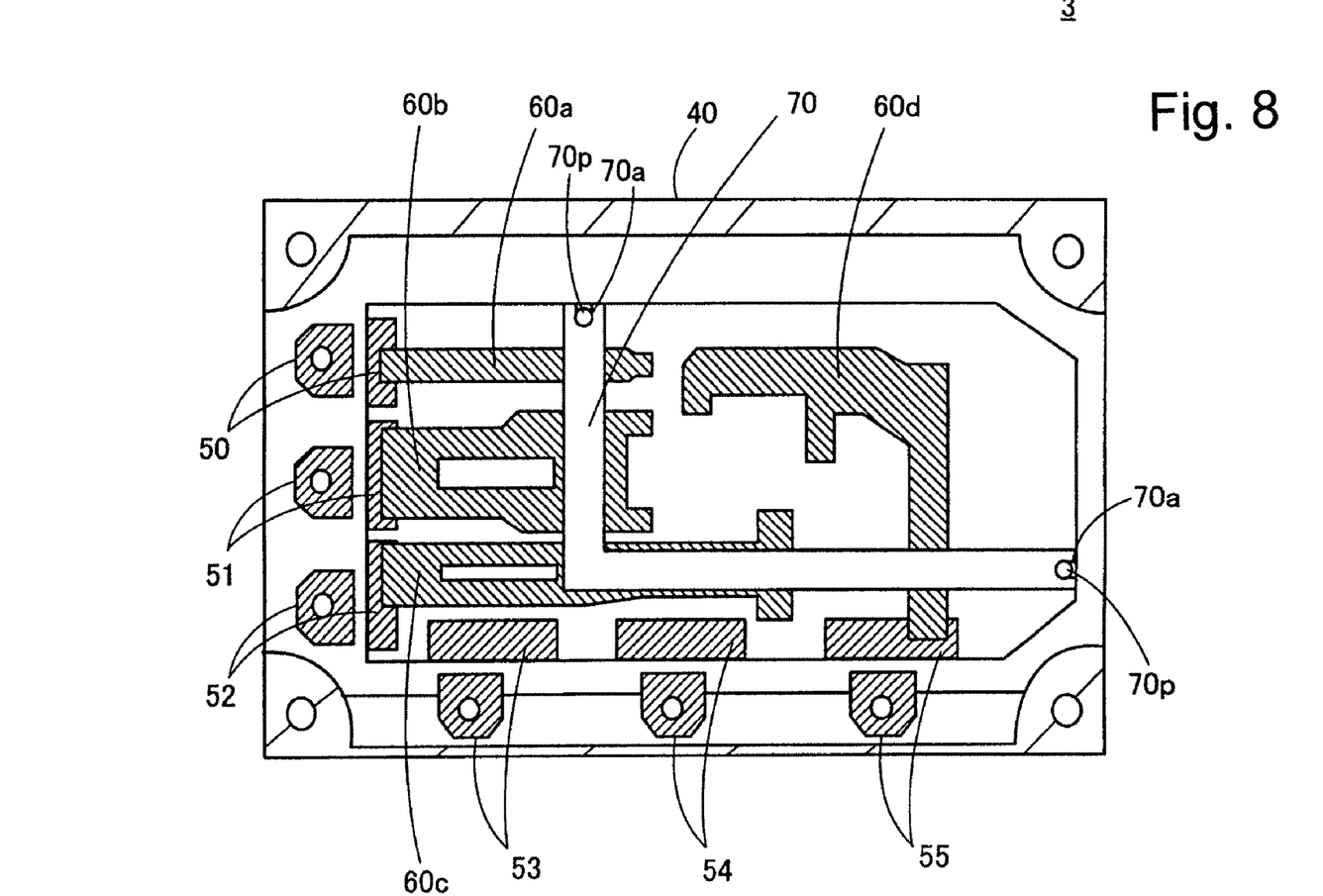
FIG. 8 is a schematic view of main part of a modification of the semiconductor device according to the first embodiment.

For example, FIG. 8 is a schematic view showing main part of a semiconductor device 3 as a modification of the semiconductor device according to the first embodiment. Incidentally, semiconductor elements etc. disposed in the resin case 40 are not shown in FIG. 8.

As shown in FIG. 8, in the semiconductor device 3, external connection terminals 50, 51, 52, 53, 54 and 55 are fixed and supported in the resin case 40 so that lines of the external connection terminals 50, 51 and 52 are perpendicular to lines of the external connection terminals 53, 54 and 55. A plurality of wiring terminals 60a, 60b, 60c and 60d are fixed to an L-shaped insulating plate 70 through an adhesive member (not shown).

Notches 70a are provided in the insulating plate 70. The notches 70 are fitted to fixation pins 70p fixedly provided in the resin case 40. Ends of the wiring terminals 60a, 60b, 60c and 60d are joined to the external connection terminals 50, 51, 52 and 55 respectively by soldering or the like.

As described above, the L-shaped insulating plate 70 which supports parts of the wiring terminals 60a, 60b, 60c and 60d may be provided as a terminal block.

Second Embodiment

Another semiconductor device 4 as a modification of the semiconductor device 1 will be described below.

Figure 9A:
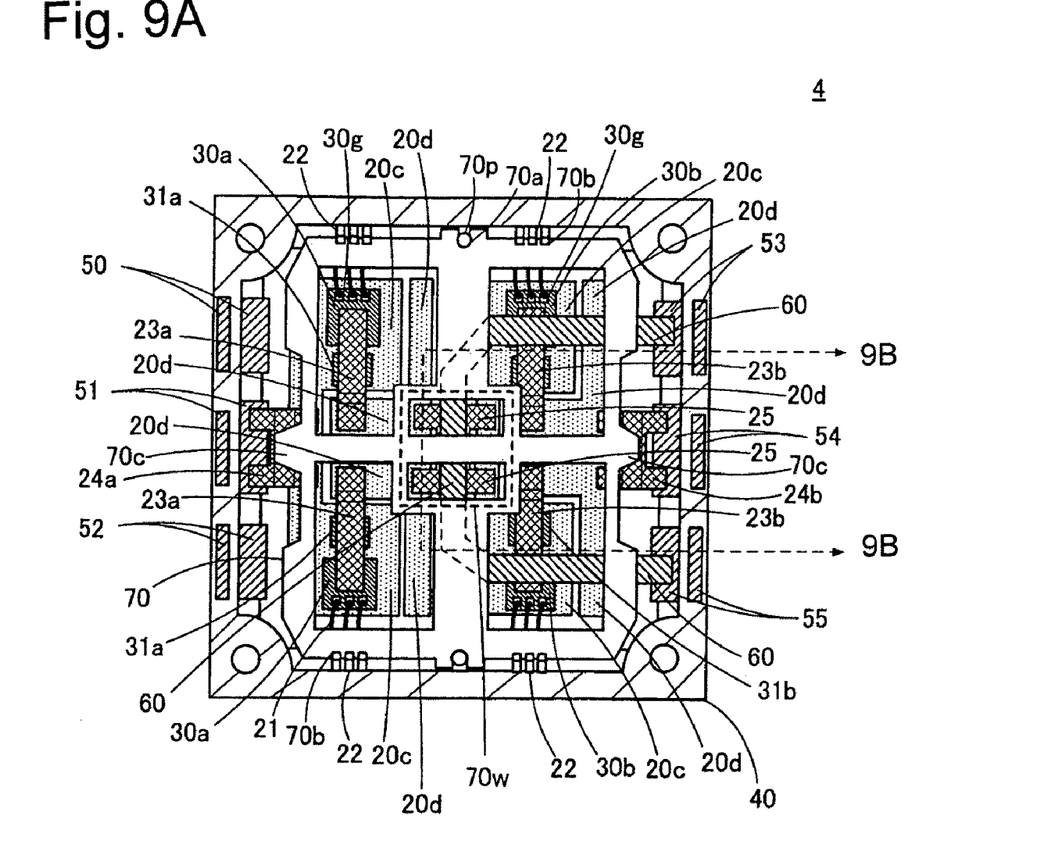
FIGS. 9A and 9B are schematic views of main part of a semiconductor device according to a second embodiment of the invention.
Figure 9B:
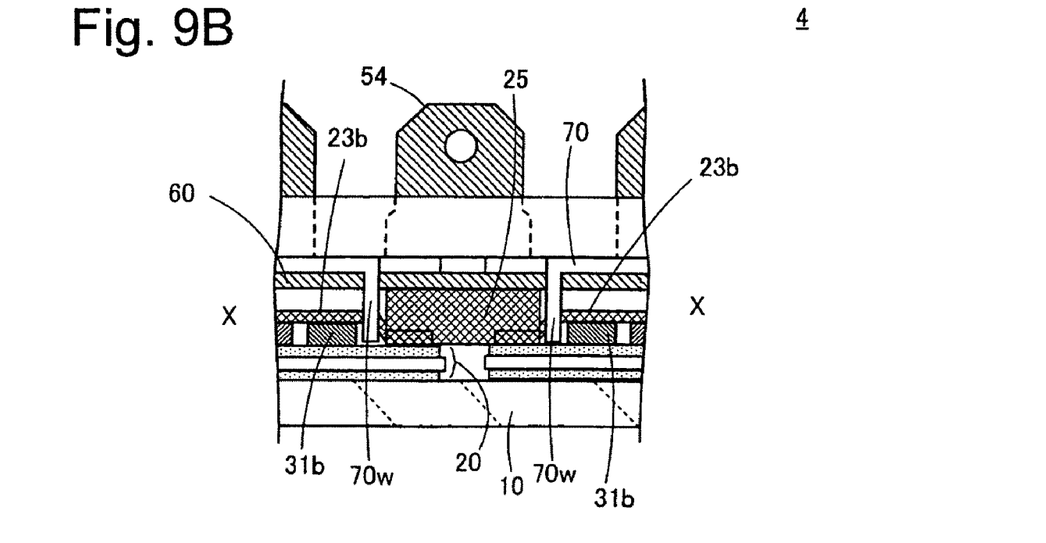

FIGS. 9A, 9B are schematic views of main part of a semiconductor device according to a second embodiment of the invention. FIG. 9A is a schematic plan view showing the semiconductor device. FIG. 9B is a sectional view showing the semiconductor device taken along a broken line 9B-9B in FIG. 9A and viewed in an arrow direction.

As shown in FIGS. 9A, 9B, in the semiconductor device 4, an extension portion 70w is provided in an insulating plate 70 so that the extension portion 70w surrounds the outer circumference of a joint portion between the wiring terminal 60 and the terminal holder 25 serving as a member joined to the wiring terminal 60.

The extension portion 70w in the insulating plate 70 makes it possible to surely capture minute slugs in a space surrounded by the insulating plate 70 and the extension portion 70w when, for example, the minute slugs are generated at the time of joining of the wiring terminal 60 to the terminal holder 25 by soldering or the like.

Accordingly, even when the slugs are generated, the presence of the extension portion 70w can prevent the slugs from adhering to the IGBT elements 30a, 30b, the FWD elements 31a, 31b, the metal foils 20c, 20d, etc. Thus, deterioration of the semiconductor elements, short-circuiting, etc. can be avoided.

Third Embodiment

Further, another semiconductor device 5 provided as a modification of the semiconductor device 1 will be described below.

Figure 10A:
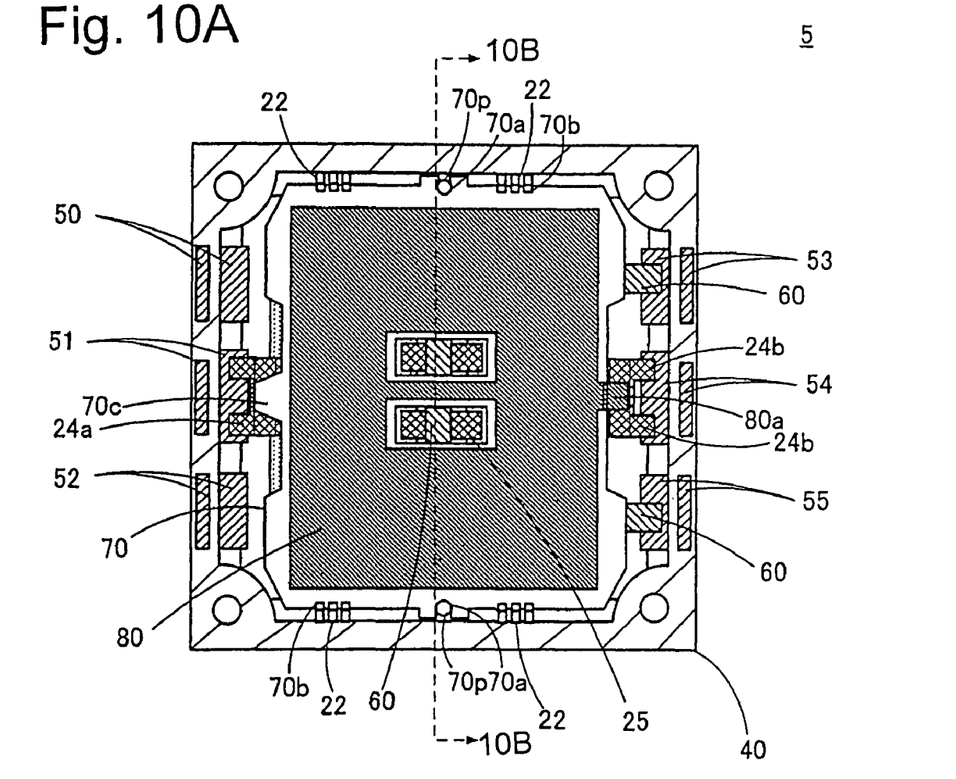
FIGS. 10A and 10B are schematic views of main part of a semiconductor device according to a third embodiment of the invention.
Figure 10B:
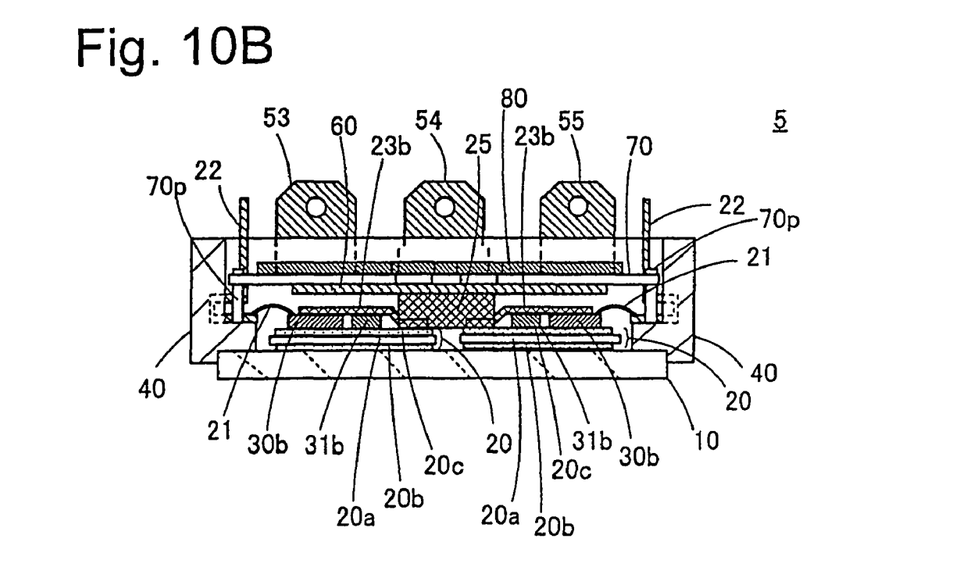

FIGS. 10A, 10B are schematic views of main part of a semiconductor device according to a third embodiment of the invention. FIG. 10A is a schematic plan view showing the semiconductor device. FIG. 10B is a sectional view showing the semiconductor device taken along a broken line 10B-10B in FIG. 10A and viewed in an arrow direction.

As shown in FIGS. 10A, 10B, in the semiconductor device 5, a metal plate 80 is fixed and disposed selectively on the insulating plate 70. In addition, the metal plate 80 has an extension portion 80a. The extension portion 80a is electrically connected, through the terminal holder 24b, to an external connection terminal 54 which serves as a negative electrode input terminal.

In such a structure, the metal plate 80 can function as a shied plate for a safeguard against electromagnetic wave emitted from the semiconductor elements etc. For example, the semiconductor device 5 can stably operate a control circuit etc. attached to the outside of the semiconductor device 5.

The semiconductor device 1 including one terminal block 70b1 attached thereto is shown in FIGS. 1A, 1B. However, the number of attached terminal blocks 70b1 is not limited to this number. That is, a plurality of terminal blocks 70b1 may be attached so that wiring terminals 60 can be disposed three-dimensionally.

The aforementioned first to third embodiments are not necessarily independent of one another, but at least two of the embodiments may be combined.

The disclosure of Japanese Patent Application No. 2007-313488 filed on Dec. 4, 2007 is incorporated as a reference.

While the invention has been explained with reference to the specific embodiments of the invention, the explanation is illustrative and the invention is limited only by the appended claims.

What is claimed is:

1. A semiconductor device, comprising:
   a resin case having at least one pin;
   a plurality of external connection terminals fixedly provided on the resin case;
   at least one semiconductor element provided in the resin case; and
   at least one terminal block having
      at least one wiring terminal for electrically connecting the at least one semiconductor element and at least one of the external connection terminals and a support substrate for supporting the at least one wiring terminal, wherein the support substrate has at least one first notch, the first notch being fitted with the at least one pin to fix the at least one terminal block to the resin case.

2. A semiconductor device, comprising:

a resin case;

a plurality of external connection terminals fixedly provided on the resin case;

at least one semiconductor element provided in the resin case;

at least one terminal block having at least one wiring terminal for electrically connecting the at least one semiconductor element and at least one of the external connection terminals; and an insulating substrate provided in the resin case, and a terminal holder provided on the insulating substrate for supporting the wiring terminal, wherein the terminal block has an extension portion to surround an outer circumference of a connecting portion between the wiring terminal and the terminal holder.

3. A semiconductor device according to claim 1, wherein the semiconductor element includes a control electrode and a pin terminal conductively connected to the control electrode, and the terminal block has a second notch for supporting the pin terminal.

4. A semiconductor device according to claim 1, wherein the terminal block has a shield layer disposed selectively thereon.

5. A semiconductor device according to claim 1, wherein the semiconductor device has a plurality of said terminal blocks, each terminal block having the wiring terminal so that the wiring terminals are sterically arranged.

6. A semiconductor device according to claim 1, wherein the support substrate is formed of a resin or a ceramic as a main component.

7. A semiconductor device according to claim 1, wherein the wiring terminal is insert-molded into the terminal block.

8. A semiconductor device, comprising:

a resin case;

a plurality of external connection terminals fixedly provided on the resin case;

a semiconductor element provided in the resin case;

an insulating substrate fixed in the resin case;

a wiring terminal for electrically connecting the semiconductor element and at least one of the external connection terminals, the wiring terminal being disposed under the insulating substrate and partly fixed thereto; and a terminal holder disposed under the wiring terminal for connecting the at least one external connection terminal and the semiconductor element through the wiring terminal.

9. A semiconductor device according to claim 8, further comprising another semiconductor element situated adjacent to the semiconductor element, the terminal holder being disposed in a middle of the resin case to electrically be connected to the another semiconductor element.

* * * * *

UNITED STATES PATENT AND TRADEMARK OFFICE
CERTIFICATE OF CORRECTION

| | |
|---|---|
| PATENT NO. | : 8,030,749 B2 |
| APPLICATION NO. | : 12/292480 |
| DATED | : October 4, 2011 |
| INVENTOR(S) | : Shin Soyano et al. |

It is certified that error appears in the above-identified patent and that said Letters Patent is hereby corrected as shown below:

Please change column 5, line 54, "semiconductor-device" to --semiconductor device--.

Please change column 6, line 64, "FIGS. 2 and 5" to --Fig. 2 and 5--.

Please change column 8, line 51, "Dec. 4, 2007" to --December 4, 2007--.

Signed and Sealed this
Nineteenth Day of June, 2012

David J. Kappos
*Director of the United States Patent and Trademark Office*